(12) United States Patent
Hirakawa (10) Patent No.: US 8,790,121 B2
(45) Date of Patent: Jul. 29, 2014

(54) ELECTRICAL CONNECTOR AND ELECTRICAL CONNECTOR ASSEMBLY

(75) Inventor: Takeshi Hirakawa, Tokyo (JP)

(73) Assignee: Dai-Ichi Seiko Co., Ltd., Kyoto-shi (JP)

( * ) Notice: Subject to any disclaimer, the term of this patent is extended or adjusted under 35 U.S.C. 154(b) by 57 days.

(21) Appl. No.: 13/577,323

(22) PCT Filed: Feb. 1, 2011

(86) PCT No.: PCT/JP2011/052032
§ 371 (c)(1),
(2), (4) Date: Oct. 31, 2012

(87) PCT Pub. No.: WO2011/102215
PCT Pub. Date: Aug. 25, 2011

(65) Prior Publication Data
US 2013/0040505 A1   Feb. 14, 2013

(30) Foreign Application Priority Data
Feb. 19, 2010   (JP) .................................. 2010-034176

(51) Int. Cl.
*H01R 12/00*   (2006.01)
(52) U.S. Cl.
USPC .............................................. 439/63; 439/582
(58) Field of Classification Search
USPC .............................. 439/63, 578, 581, 582, 585
See application file for complete search history.

(56) References Cited

U.S. PATENT DOCUMENTS

| | | | | |
|---|---|---|---|---|
| 6,712,645 B1 * | 3/2004 | Chou | ............................. | 439/582 |
| 6,739,907 B2 * | 5/2004 | Kuroda et al. | ................ | 439/582 |
| 6,971,913 B1 * | 12/2005 | Chu | ............................... | 439/582 |
| 6,997,745 B2 * | 2/2006 | Ikeda | ............................. | 439/582 |
| 8,172,613 B1 * | 5/2012 | Chen et al. | .................... | 439/582 |

FOREIGN PATENT DOCUMENTS

| | | |
|---|---|---|
| JP | 62 5673 | 1/1987 |
| JP | 2000 353559 | 12/2000 |
| JP | 2001 43939 | 2/2001 |
| JP | 2002 324636 | 11/2002 |
| JP | 2006 216445 | 8/2006 |

OTHER PUBLICATIONS

International Search Report Issued Mar. 8, 2011 in PCT/JP11/52032 Filed Feb. 1, 2011.
U.S. Appl. No. 13/520,288, filed Jul. 2, 2012, Hirakawa.

* cited by examiner

*Primary Examiner* — Thanh Tam Le
(74) *Attorney, Agent, or Firm* — Oblon, Spivak, McClelland, Maier & Neustadt, L.L.P.

(57) ABSTRACT

An electrical connector in which a single connector is directly mated with a coupling projection part provided in a product chassis constituting an electronic device; contact parts of electrically-conductive contacts are brought into contact with both contact parts of a wiring pattern exposed from upper and lower both surfaces of the coupling projection part; electrical connection of the signal transmission medium is established with a simple configuration without intermediation of a conventionally-used circuit board or an electrical connector serving as a mating counterpart mounted on the circuit board; pressing force of the electrically-conductive contacts is cancelled out and approximately uniformly applied without unevenness; the protruding distance of the mating structure of the electrical connector is reduced to reduce the thickness thereof; and reversed mating is enabled to increase degree of freedom in the extending direction of a terminal part of the signal transmission medium.

7 Claims, 10 Drawing Sheets

ELECTRICAL CONNECTOR AND ELECTRICAL CONNECTOR ASSEMBLY

TECHNICAL FIELD

The present invention relates to an electrical connector and an electrical connector assembly that electrically connect a terminal part of a signal transmission medium to a wiring pattern.

BACKGROUND ART

Figure 10:
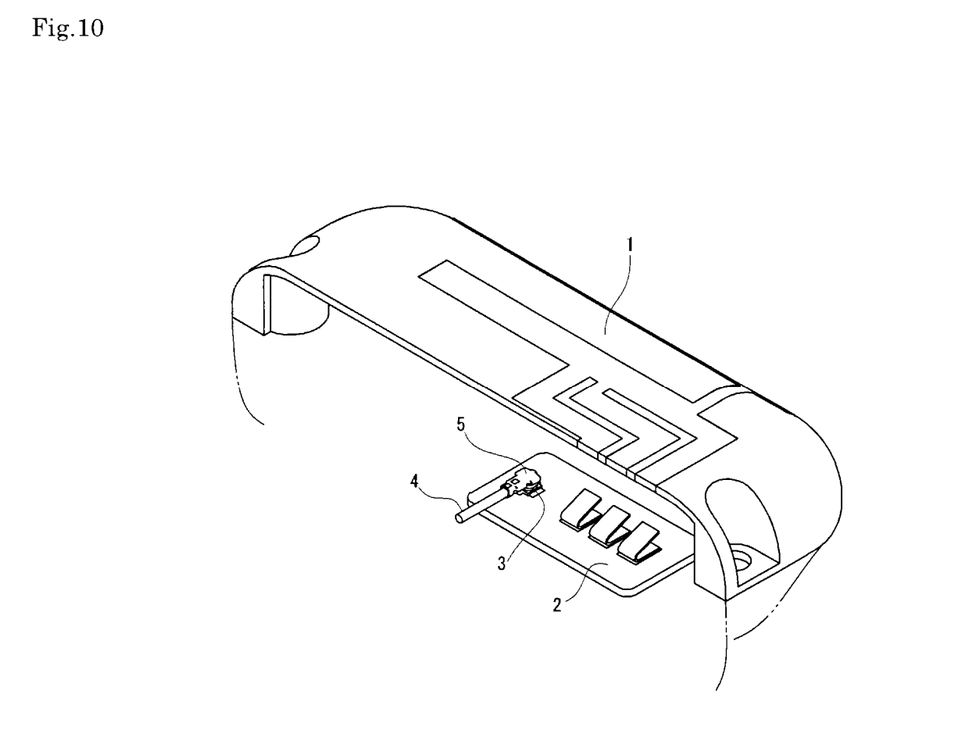
FIG. 10 is an external perspective explanatory drawing showing a connection state according to a general electrical connector, which is normally used.

Generally, in various electronic devices or electrical devices such as mobile phones, a terminal part of each of various signal transmission media composed of, for example, thin coaxial cables, flexible wiring boards, or printing wiring boards has been commonly connected to a printed wiring board side by using an electrical connector (for example, see below-described Patent Literature 1). The electrical connector of this case connects the terminal part of the signal transmission medium to a predetermined wiring pattern (circuit). Normally, for example as shown in FIG. 10, a receptacle connector 3 is mounted on a circuit board 2 attached to an inner part of a product chassis 1, and a plug connector 5, which is coupled to a terminal part of a signal transmission medium 4 composed of a thin coaxial cable or the like, is configured to be mated with the receptacle connector 3. The pair of the electrical connectors 3 and 5 used in this case has a function to carry out transmission of necessary information signals through signal lines and to connect a shield signal for grounding to a ground circuit through a shield line.

On the other hand, recently, reduction in size/thickness of electronic devices, etc. has been rapidly advanced, and the height and cost of electrical connectors have been accordingly reduced. Therefore, simplifying the above described configuration of the electrical connectors 3 and 5 has been strongly required. In order to omit the receptacle connector 3, it is conceivable to directly solder a connection leg part of the plug connector 5 to an electrically conductive path on the product chassis 1. However, since the product chassis 1 is made of a resin molding material, the chassis has low thermal resistance, and this state does not allow direct soldering or mounting of an electronic part to the product chassis 1. Therefore, all of normally-used electrical connectors have a basic configuration that one of the electrical connectors (receptacle connector) 3 is mounted on the printed wiring board 2 having a wiring pattern and the other electrical connector (plug connector) 5 is in a state mated therewith. Due to restrictions of such a basic configuration, it is becoming difficult to significantly reduce the height and cost.

CITATION LIST

Patent Literature

Patent Literature 1: Japanese Patent Application Laid-Open No. 2001-43939
Patent Literature 2: Japanese Patent Application Laid-Open No. 2002-324636

DISCLOSURE OF THE INVENTION

Problems to be Solved by the Invention

Therefore, it is an object of the present invention to provide an electrical connector and an electrical connector assembly which are capable of significantly reducing the height and cost thereof by a simple configuration.

Means for Solving the Problems

In order to achieve the above described object, an electrical connector according to the present invention employs a configuration of an electrical connector for electrically connecting a terminal part of a signal transmission medium to a wiring pattern of a wall part of a product chassis, the wiring pattern formed on a surface of the wall part constituting the product chassis of an electronic device having a predetermined electronic circuit, the electrical connector having a main body part to which an electrically-conductive contact having a contact part elastically in contact with the wiring pattern is attached; wherein a coupling projection part composed of a plate-like member is provided in the wall part constituting the product chassis so as to project like a cantilever, and the main body part is configured to be able to be mated with the coupling projection part; the wiring pattern is provided with a contact part exposed from at least one of upper and lower both surfaces of the plate-like member constituting the coupling projection part; the electrically-conductive contact is disposed so as to extend along a direction approximately parallel to a direction of mating with the coupling projection part; and the contact part of the electrically-conductive contact is disposed so as to sandwich the coupling projection part from the upper and lower both surfaces and be in contact with the contact part of the wiring pattern in a state in which the main body part is mated with the coupling projection part.

An electrical connector assembly according to the present invention employs a configuration composed of a product chassis constituting an electronic device having a predetermined electronic circuit and having a wiring pattern for transmitting a signal formed on a surface of a wall part; and the above described electrical connector.

According to such a configuration, the single connector is configured to be directly mated with the coupling projection part provided in the wall part of the product chassis constituting the electronic device having the predetermined electronic circuit; and, in the mated state of the single connector, the contact parts of the electrically-conductive contacts are brought into contact with the contact parts of the wiring pattern exposed from at least one of the upper and lower both surfaces of the coupling projection part. Therefore, without the intermediation of a conventionally-used circuit board and an electrical connector serving as a mating counterpart mounted on the circuit board, electrical connection of a signal transmission medium can be established by a simple configuration.

Particularly, in the present invention, mating of the electrical connector is carried out in the state in which the electrically-conductive contacts are in contact, with pressure, with both of the upper and lower surfaces of the coupling projection part of the product chassis; therefore, the pressing force of both of the electrically-conductive contacts can be approximately uniformly applied without unevenness so as to cancel out the force with the upper and lower both surfaces of the coupling projection part. The mating structure of the electrical connector is composed of both of the upper and lower surfaces of the product chassis; therefore, the protruding distance in the thickness direction of the wall part of the product chassis is reduced, and the thickness of the electrical connector is reduced. Moreover, even when the electrical connector is reversed with respect to the upper and lower both surfaces of the product chassis and mated therewith, a similar mating structure can be obtained; therefore, the degree of freedom in the extending direction of the terminal part, which is a signal transmission medium, is increased.

Moreover, in the present invention, it is desired that the electrically-conductive contact be composed of a signal contact for transmitting a signal and ground contacts for grounding disposed in both sides of the signal contact.

When such a configuration is employed, the ground contacts are disposed in both sides of the signal contact; therefore, adjustment of impedance, etc. with respect to the signal contact is carried out well.

Furthermore, in the present invention, a ground coupling plate integrally coupling the ground contacts for grounding, which are disposed in both sides of the signal contact, to each other is provided. The ground coupling plate is desired to be disposed in the side closer to the front than the mating-direction front-end part of the signal contact is.

When such a configuration is employed, the free-end parts of the ground contacts are retained by the ground coupling plate to enhance the rigidity thereof, and the free-end part of the signal contact is protected by the ground coupling plate. Therefore, deformation thereof upon mating of the electrical connector is prevented, and good mating operation is carried out.

The coupling projection part and the main body part in the present invention are desired to be provided with a lock part configured to enable engagement/disengagement in the mating direction.

When such a configuration is employed, the electrical connection state of the electrically-conductive contacts is stably maintained by the lock part to improve resistance to vibrations and resistance to shock, and mating operation is smoothly carried out since a so-called clicking sensation can be obtained upon mating.

Moreover, in the present invention, a contact part provided in the ground contact is desired to be disposed in a side closer to a front in the mating direction than a contact part provided in the signal contact is.

When such a configuration is employed, the load generated upon mating or removing of the electrical connector with respect to the coupling projection part is dispersed among the ground contacts and the signal contact, workability is improved since the working force in the mating/removing of the electrical connector is reduced, and, since the ground circuit is formed before the signal circuit is formed, the ground circuit functions as a protective circuit of the signal circuit to improve safety.

Advantageous Effects of Invention

As described above, in the present invention, the single connector is directly mated with the coupling projection part provided in the wall part of the product chassis constituting the electronic device having the predetermined circuit; as a result, the contact parts of the electrically-conductive contacts are brought into contact with both of the contact parts of the wiring pattern exposed from the upper and lower both surfaces of the coupling projection part, and electrical connection of the signal transmission medium can be established with a simple configuration without the intermediation of a conventionally-used circuit board and an electrical connector serving as a mating counterpart mounted on the circuit board. The pressing force of the electrically-conductive contacts is cancelled out and applied approximately uniformly without unevenness by a press-contact structure of the electrically-conductive contact with respect to the upper and lower both surfaces of the coupling projection part of the product chassis.

The protruding distance is reduced to reduce the thickness of the electrical connector by dispersing the mating structure of the electrical connector to the upper and lower both surfaces of the product chassis. The degree of freedom of the extending direction of the terminal part of the signal transmission medium is configured to be increased by the mating structure which is similar even when the electrical connector is reversely mated. Therefore, by omitting, for example, the circuit board and the electrical connector of the mating counterpart, the configuration of the electrical connector can be extremely simplified, and the height and cost of the electrical connector can be significantly reduced.

DESCRIPTION OF EMBODIMENT

Hereinafter, an embodiment of a case in which the present invention is applied to an electrical connector of a horizontal mating type configured so as to be directly mated with a product chassis of an electronic device from a lateral side by using a thin coaxial cable as a signal transmission medium will be described in detail based on drawings.

A plug connector 10 according to the embodiment of the present invention shown in FIG. 1 to FIG. 9 is configured to be directly mated with a wall part of a product chassis MF, which constitutes an electronic device such as a mobile phone having a predetermined electronic circuit. A wiring pattern CP, which constitutes part of antennas or various circuits, is formed, for example by printing, on an inner surface or an outer surface of the wall part, which constitutes the product chassis MF of the electronic device. A terminal part of a thin coaxial cable SC formed as a signal transmission medium is configured to be electrically connected to the wiring pattern CP, which is formed on the surface of the product chassis MF, via the plug connector 10 according to the embodiment of the present invention.

Figure 1:
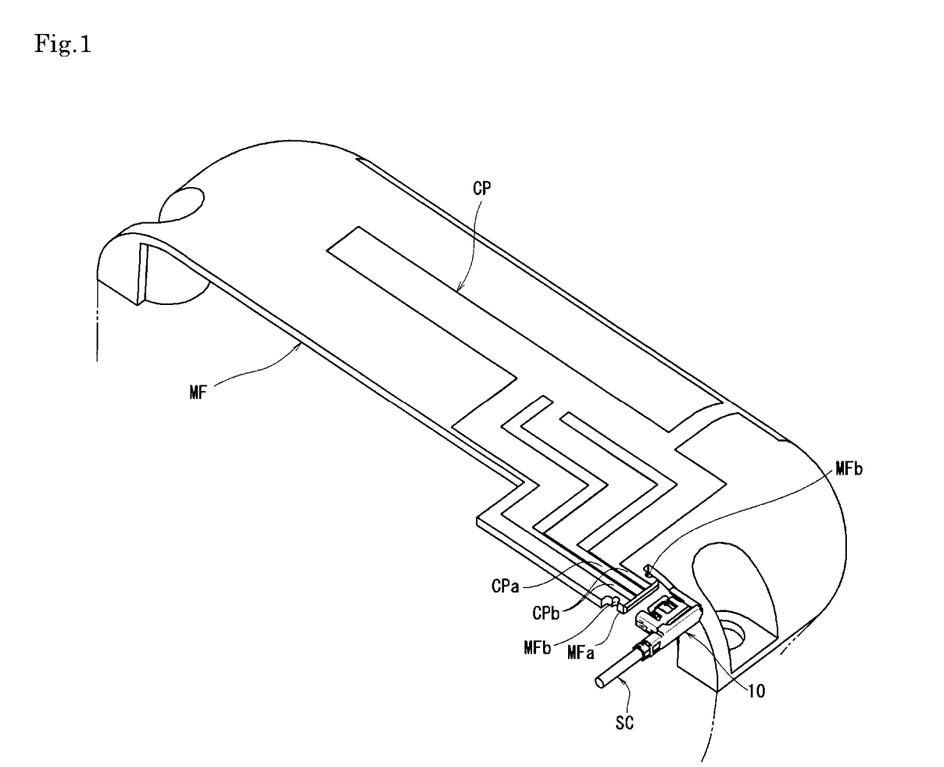
FIG. 1 is an external perspective explanatory drawing showing an intermediate state of connecting operation using an electrical connector according to an embodiment of the present invention.
Figure 2:
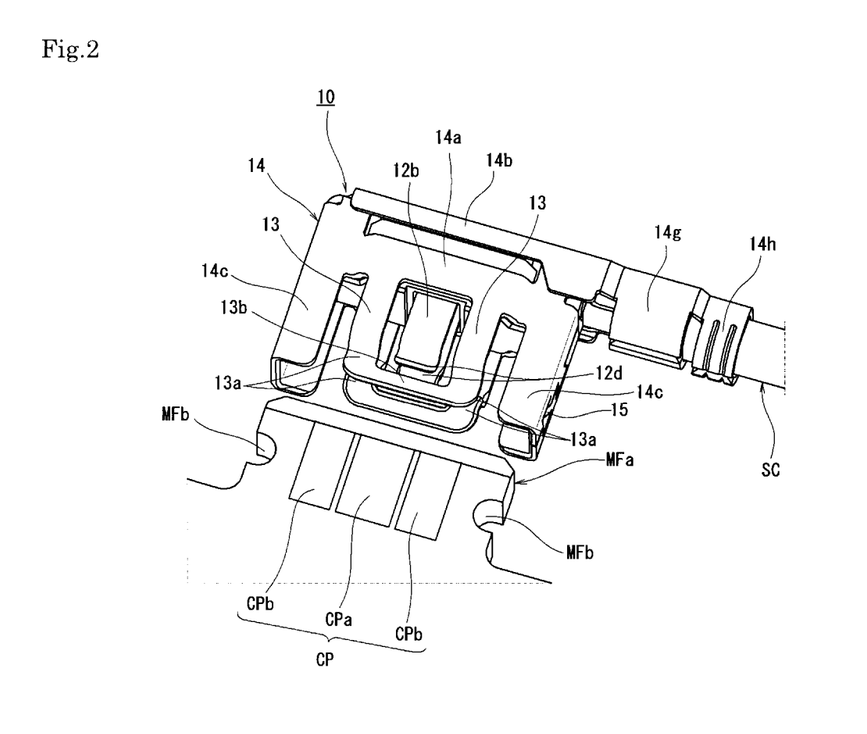
FIG. 2 is an external perspective explanatory drawing showing, from a front side of a mating direction, a state before a plug connector according to the embodiment of the present invention shown in FIG. 1 is mated.
Figure 3:
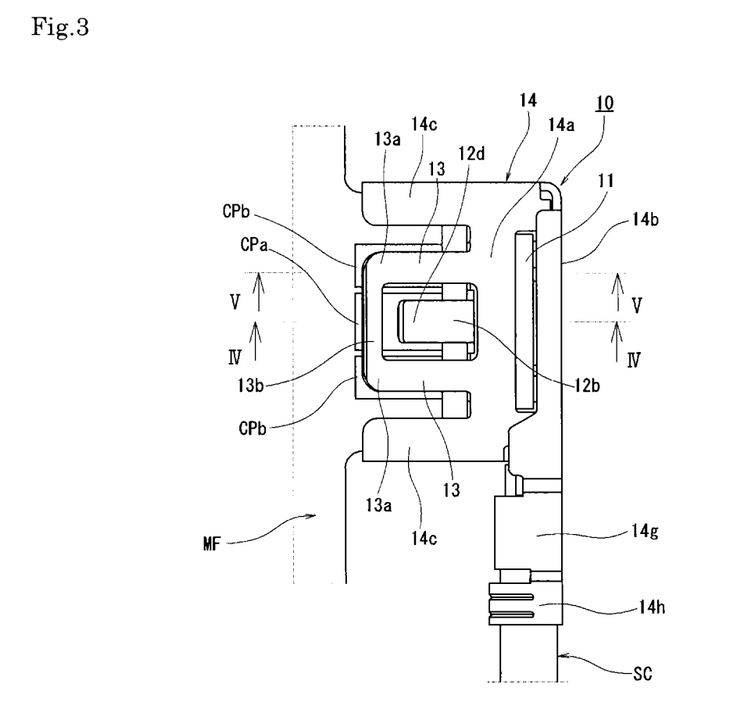
FIG. 3 is a plan explanatory drawing showing, from an upper side, a structure of the plug connector according to the embodiment of the present invention shown in FIG. 1 and FIG. 2.
Figure 4:
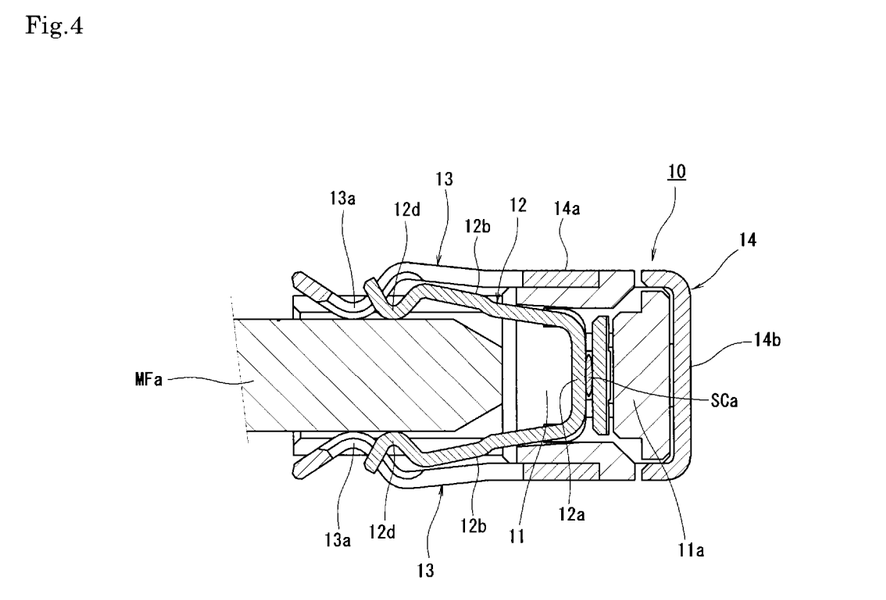
FIG. 4 is a vertical cross-sectional explanatory drawing taken along a line IV-IV in FIG. 3.
Figure 5:
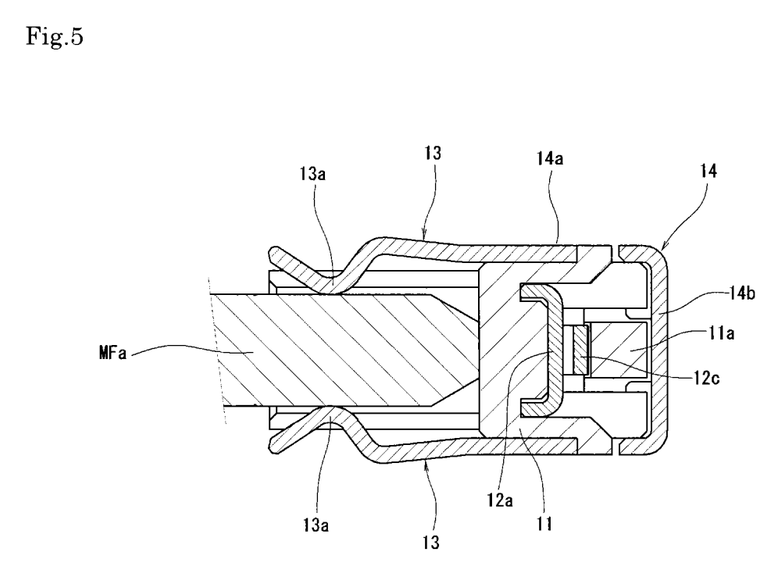
FIG. 5 is a vertical cross-sectional explanatory drawing taken along a line V-V in FIG. 3.

More specifically, at a first-end edge part provided in the wall part of the above described product chassis MF, a coupling projection part MFa projecting like a cantilever from the first-end edge part is formed; and the plug connector 10 is configured to be mated with the coupling projection part MFa, which is provided in the wall part of the product chassis MF and is composed of a plate-like member. The terminal part of the thin coaxial cable SC serving as a signal transmission medium is coupled to the plug connector 10 in a later-described manner; and, first, the plug connector 10, which is in the state that the plug connector is coupled to the thin coaxial cable SC, is disposed so as to face the coupling projection part MFa in an approximately parallel direction as shown in FIG. 1 and FIG. 2. Then, the plug connector 10 is moved so as to move forward in an approximately parallel direction with respect to upper and lower both surfaces of the wall part of the product chassis MF, and mating is carried out so that outside of the entirety of the coupling projection part MFa is covered with the plug connector 10 as shown in FIG. 3 to FIG. 5.

The terminal part of the thin coaxial cable SC is configured to be connected to the wiring pattern CP in the state in which the plug connector 10 is mated with the coupling projection part MFa of the product chassis MF in this manner. Hereinafter, regarding the plug connector 10, the direction in which the plug connector 10 is inserted will be referred to as a forward direction, and a removing direction in which the plug connector is reversely removed will be referred to as a backward direction. Also, regarding the coupling projection part MFa, the direction in which the coupling projection part is projecting toward the plug connector 10 side will be referred to as a forward direction, and the direction opposite thereto will be referred to as a backward direction.

As described above, the coupling projection part MFa is formed of a plate-like member that forms an approximately rectangular shape in a planar view. Regarding the upper and lower both surfaces in the thickness direction of the plate-like member constituting the coupling projection part MFa, the plate-width direction which is the direction orthogonal to the mating direction of the plug connector 10 will be referred to as a left-right direction.

At least on one of the plate-thickness-direction upper and lower both surfaces of the coupling projection part MFa composed of the plate-like member, a terminal part of the above described wiring pattern CP is formed from the rear side to the front side, in other words, so as to extend toward the projecting direction of the coupling projection part MFa. An electrically-conductive signal path CPa is disposed at a left-right-direction (plate-width direction) center part of the coupling projection part MFa, and electrically-conductive ground paths CPb are formed in both sides thereof, which are adjacent to the electrically-conductive signal path CPa to be in the same direction, so as to extend approximately parallel. The electrically-conductive signal path CPa and the electrically-conductive ground paths CPb constituting the wiring pattern CP are formed so as to be exposed on at least one of the upper and lower both surfaces of the coupling projection part MFa, and contact parts are provided at the exposed parts thereof. If electrically-conductive signal paths CPa are formed on both of the upper and lower surfaces of the coupling projection part MFa, a step of mutually connecting the patterns of the electrically-conductive signal paths CPa between the upper surface and the lower surface is added, and, in addition to that, it becomes difficult to mutually adjust the characteristics of the upper and lower two electrically-conductive signal paths CPa. Therefore, a method in which the electrically-conductive signal path CPa is provided on either one of the upper and lower surfaces is generally used.

On the other hand, the plug connector 10 is composed as a horizontal-mating-type connector, which is to be mated approximately horizontal with the coupling projection part MFa of the product chassis MF as described above, and the terminal part of the thin coaxial cable SC, which is serving as an example of a signal transmission medium, is coupled to a rear-side end edge part of the plug connector 10. The thin coaxial cable SC is extended from the rear-side end edge part of the plug connector 10 so as to be approximately along the left-right direction which is the direction orthogonal to the above described mating direction.

The terminal part of the thin coaxial cable SC serving as the signal transmission medium coaxially exposes a cable central conductor (signal line) SCa and a cable external conductor (shield line) SCb when an outer-peripheral covering material is peeled off, and a signal circuit is formed when the cable central conductor SCa disposed along the central axis line of the thin coaxial cable SC is connected to electrically-conductive signal terminals (signal contacts) 12 attached to an insulating housing 11 serving as a main body part. A ground circuit is configured to be formed when the cable exterior conductor SCb disposed so as to surround the outer-peripheral side of the above described cable central conductor SCa is connected to electrically-conductive ground terminals (ground contacts) 13, which are integrally provided with a later-described electrically-conductive shell 14.

The insulating housing 11 constituting the main body part of the plug connector 10 is composed of a block-like member extending approximately in the left-right direction orthogonal to the mating direction; and, as described above, the thin coaxial cable SC, the electrically-conductive signal terminals (signal contacts) 12, and the electrically-conductive ground terminals (ground contacts) 13 are attached to and retained by the insulating housing 11. The attaching and retaining structure of the thin coaxial cable SC, the electrically-conductive signal terminals (signal contacts) 12, and the electrically-conductive ground terminals (ground contacts) 13 will be described later. The insulating housing 11, to which these are attached, is in an arrangement relation that, when the plug connector 10 is mated with the coupling projection part MFa of the above described product chassis MF, a first-end surface (front-end surface) of the insulating housing 11 abuts a distal-end edge of the coupling projection part MFa.

Figure 9:
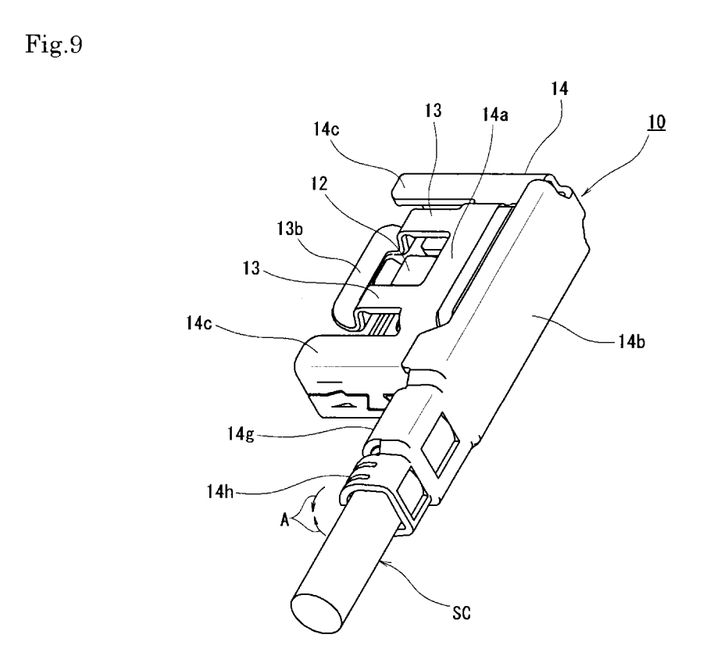
FIG. 9 is an external perspective explanatory drawing showing, for the rear side, a state in which a cover part of an electrically-conductive shell is bent for covering after the thin coaxial cable serving as the signal transmission medium is set with respect to the plug connector shown in FIG. 1 to FIG. 5.

The outer surface of the insulating housing 11 is covered with the electrically-conductive shell 14 composed of a member like a thin metal plate. Particularly as shown in FIG. 6 and FIG. 9, the electrically-conductive shell 14 is composed of; a shell main-body part 14a, which circularly covers the outer-peripheral lateral surface of the insulating housing 11; a shell cover part 14b, which covers a rear-end-side part of the insulating housing 11; and shell mating parts 14c disposed so as to project from the shell main-body part 14a toward the front side.

The shell main-body part 14a among these is formed so as to form a hollow annular body having an approximately rectangular opening when viewed from the front or rear and has a front-end opening and a rear-end opening communicating in the front-rear direction; and, the shell main-body part 14a is therefore attached so as to surround a lateral wall part of the insulating housing 11 from an outer peripheral side as described above. The shell mating parts 14c forming an approximately "U"-shape in a transverse cross section are provided so as to project toward the front from both left and right sides of the front-end openings of the shell main-body part 14a. The pair of shell mating parts 14c and 14c disposed in the both left and right sides constitute part of the main body part as well as the above described insulating housing 11 and are disposed so that the hollow parts of the approximately "U"-shapes are opposed to each other in the left-right direction. Since both the shell mating parts 14c and 14c are provided so as to extend along the front-rear direction, an insertion mating opening which receives, to the inner side thereof, the above described coupling projection part MFa composed of the plate-like member is formed at a front-end-side part of the shell mating parts 14c.

Figure 8:
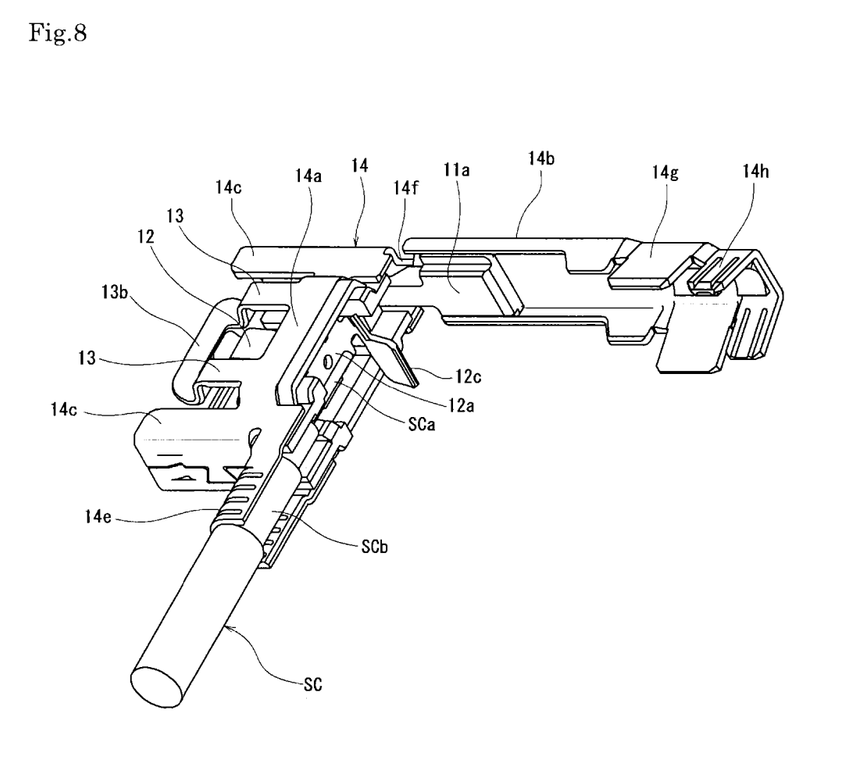
FIG. 8 is an external perspective explanatory drawing showing, from the rear side, a state in which the thin coaxial cable serving as the signal transmission medium is set with respect to the plug connector shown in FIG. 1 to FIG. 5.

At the rear-end opening of the above described shell main-body part 14a, a cable supporting part 14e, which is open toward the rear side and forms an approximately semi-circular shape in a cross section, is provided at a first-end part in the left-right direction (lower-end part in FIG. 8). The cable supporting part 14e is provided so as to project approximately horizontally in the left-right direction (downward direction in FIG. 8) from the shell main-body part 14a, and the terminal part of the above described thin coaxial cable SC is configured to be placed on and received by an inner wall surface of the cable supporting part 14e.

Figure 6:
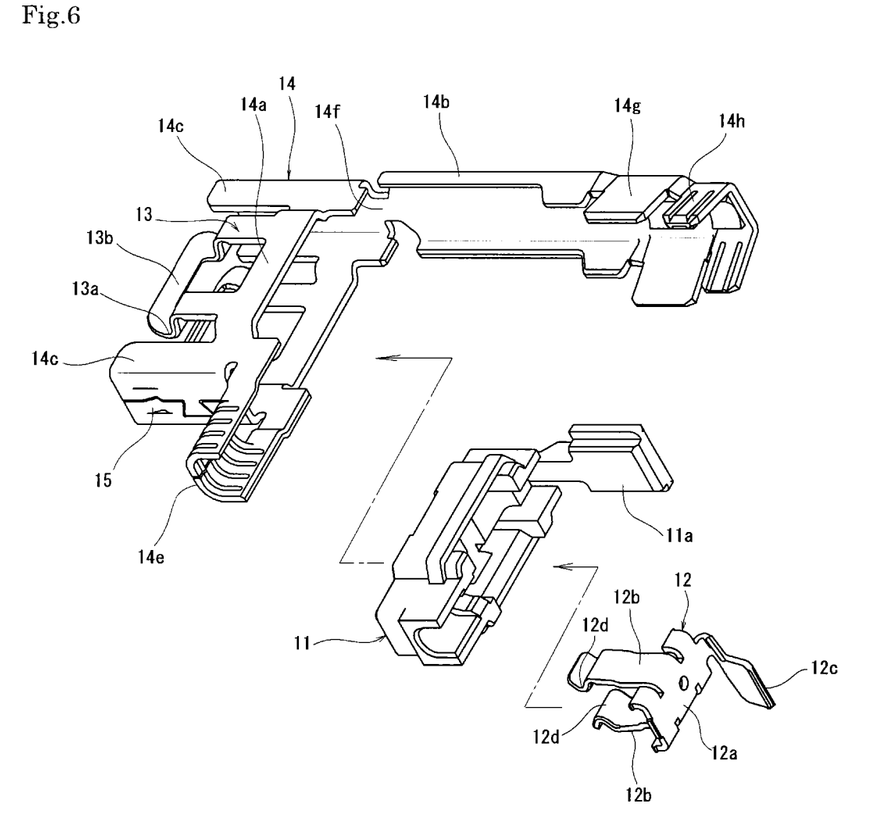
FIG. 6 is an external perspective explanatory drawing showing, from a rear side, the plug connector shown in FIG. 1 to FIG. 5 disassembled into parts.
Figure 7:
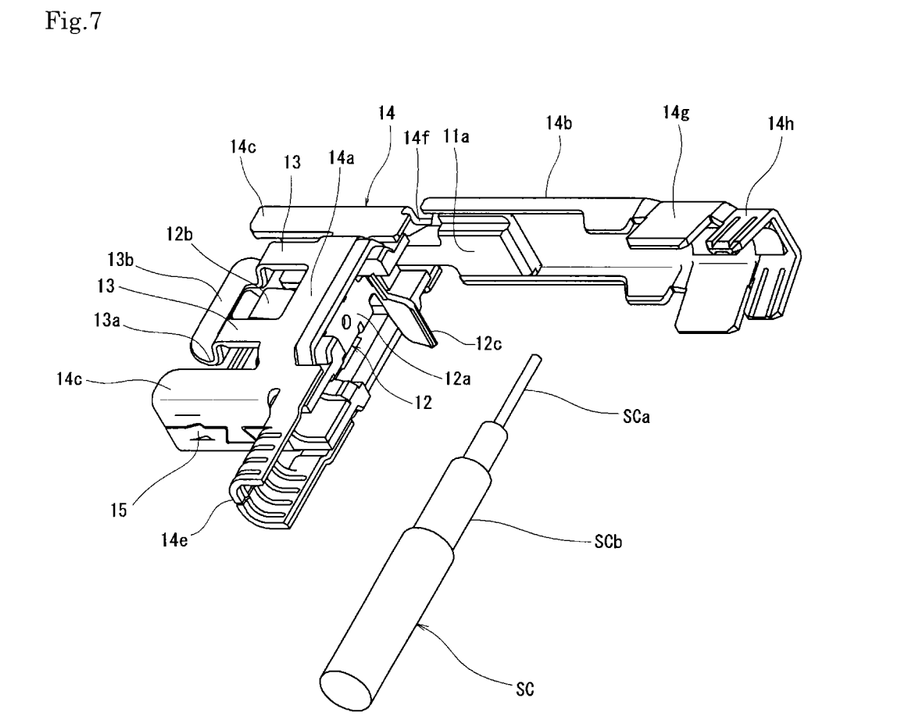
FIG. 7 is an external perspective explanatory drawing showing, from the rear side, a state before a thin coaxial cable serving as a signal transmission medium is coupled to the plug connector shown in FIG. 1 to FIG. 5.

Furthermore, in a state before the terminal part of the thin coaxial cable SC is coupled, in other words, in an initial state, the shell cover part 14b of the above described electrically-conductive shell 14 is in an open state as shown in FIG. 6 to FIG. 8. The shell cover part 14b in the initial state is formed at the end part positioned in the opposite side of the above described cable supporting part 14e so as to project toward the rear side via a shell coupling plate 14f having a narrow shape. An insulating pressing plate 11a, which is provided so as to protrude from the insulating housing 11 similarly toward the rear side, is disposed so as to be along an inner surface side of the shell coupling plate 14f.

In the above described open state of the electrically-conductive shell 14, in the state of FIG. 7, the terminal part of the thin coaxial cable SC is placed and set so as to be received by the cable supporting part 14e as shown in FIG. 8; then, as shown in FIG. 9, the shell coupling plate 14f is bent approximately at right angle together with the insulating pressing plate 11aAs a result, the shell cover part 14b of the electrically-conductive shell 14, which has been extending in the front-rear direction in the initial state, is bent like being pushed down so as to be turned to an assembled state in which the shell cover part 14b is extending in the left-right direction. As a result, a rear-end face of the insulating housing 11 and the rear-end opening of the shell main-body part 14a are covered with the shell cover part 14b from the rear side to cause the electrically-conductive shell 14 to be in a closed state.

The shell cover part 14b, which has been caused to be in the closed state in this manner, is configured to cover the outer peripheral surface of the shell main-body part 14a from the rear outer side and to cover the above described cable supporting part 14e and the thin coaxial cable SC from the rear outer side. More specifically, the shell cover part 14b is provided with a first retaining part 14g and a second retaining part 14h at the positions corresponding to the above described cable supporting part 14e and the thin coaxial cable SC so as to form U-shapes in transverse sections. The first retaining part 14g and the second retaining part 14h are formed so that the open-side parts thereof in the U-shapes of the transverse sections face the cable supporting part 14e and the thin coaxial cable SC and are configured so as to cover the cable supporting part 14e and the thin coaxial cable SC in U-shapes in vertical cross sections when the shell cover part 14b is bent so as to extend in the approximately left-right direction in the above described manner. Distal-end parts of both-side plate-like members constituting the open parts of the first retaining part 14g and the second retaining part 14h are bent inward as shown by, for example, arrows A of FIG. 9 and caused to be in a fixed state by swaging. As a result, the cable external conductor SCb is brought into contact with the cable supporting part 14e and the first retaining part 14g. As a result, the ground circuit using the electrically-conductive shell 14 is formed.

The electrically-conductive ground terminals (ground contacts) 13 are configured to be integrally provided with the shell main-body part 14a of the above described electrically-conductive shell 14, and the electrically-conductive ground terminals 13 are formed so as to project to the front side from the front-end-side opening edge part of the shell main-body part 14a. The electrically-conductive ground terminals 13 are provided to correspond to the plate-thickness-direction upper and lower both surfaces of the above described coupling projection part MFa composed of the plate-like member, and the electrically-conductive ground terminal 13 corresponding to one of the upper and lower both surfaces of the coupling projection part MFa and the electrically-conductive ground terminal 13 corresponding to the other one thereof are configured to be symmetrical to each other in the plate-thickness direction of the coupling projection part MFa. Therefore, hereinafter, mainly one of the electrically-conductive ground terminals 13 will be explained.

The pair of the electrically-conductive ground terminals 13, each of which is provided to correspond to either one of the upper and lower both surfaces of the coupling projection part MFa, is provided in the inner region of the pair of the shell mating parts 14c and 14c, which are provided at left and right both-side parts of the above described shell main-body part 14a so as to be opposed to each other. Each of the electrically-conductive ground terminals 13 is extending as described above from the front-end-side opening edge part of the shell main-body part 14a toward the front side, in other words, in the direction approximately parallel to the direction to be mated with the coupling projection part MFa so as to form a cantilever-shape, and the extending-side distal-end part thereof is configured to be a free-end part which can be elastically displaced in the plate-thickness direction (top-bottom direction) of the coupling projection part MFa.

Each of the free-end parts serving as the extending-side distal-end parts of the pair of the electrically-conductive ground terminals 13 and 13 is bent and formed into an approximately "V"-shape in a cross section so as to project toward the wiring pattern CP provided on the surface of the coupling projection part MFa, and ground contact parts 13a, which are to be brought into contact with the wiring pattern CP, are provided respectively at apex parts of the bent-formed parts. Each of the ground contact parts 13a is configured to be brought into contact, with pressure, with the surfaces of the electrically-conductive ground paths CPb by the upper-lower-direction elastic displacing action of the electrically-conductive ground terminals 13, which form the cantilever-shapes as described above. Electrical connection is established by the elastic contact so as to form the ground circuit.

Furthermore, the free-end parts of the pair of the electrically-conductive ground terminals (ground contacts) 13 and 13 are integrally coupled to each other by a ground coupling plate 13b, which is extending along the left-right direction. The ground coupling plate 13 has a shape that is flipped up obliquely toward the front from either one of the upper and lower both surfaces of the coupling projection part MFa.

As described above, the shell mating parts 14c form the insertion mating opening for receiving the coupling projection part MFa. When the coupling projection part MFa is mated through the insertion mating opening, the shell mating part 14c receives the elastic displacing action of the electrically-conductive ground terminals 13 via the coupling projection part MFa. Therefore, the elastic displacing force caused by the electrically-conductive ground terminals 13 is cancelled out by the shell mating parts 14c through the intermediation of the coupling projection part MFa.

Lock engaging parts 15, which are projecting toward the lateral wall surfaces of the coupling projection part MFa, are provided on left and right both-side upright wall plates constituting the shell mating parts 14c so as to form projecting shapes. Lock latching parts MFb forming recessed shapes are formed on the lateral wall surfaces of the coupling projection part MFa to correspond to the lock engaging parts 15 of the shell main-body part 14a side. The lock engaging parts 15 and the lock latching parts MFb constituting these lock parts are configured so as to be able to be engaged/disengaged with each other in the mating direction. When the plug connector 10 is mated with the coupling projection part MFa, the lock parts 15 of the shell main-body part 14a side are mated with the latching parts MFb of the coupling projection part MFa side so that the recesses and projections are mated with each other to fix the plug connector 10.

On the other hand, the electrically-conductive signal terminals (signal contacts) 12 for transmitting signals are attached to the insulating housing 11, for example, by press-fitting or insert molding, wherein the terminal is formed so as to sandwich the plate-thickness-direction upper and lower both surfaces of the above described coupling projection part MFa from both sides. Particularly as shown in FIG. 4 and FIG. 6, the electrically-conductive signal terminal 12 has: a cable sandwiching part 12a, which is connected to the cable central conductor (signal line) SCa of the above described thin coaxial cable SC, and a pair of elastic spring parts 12b and 12b, which are extended from the cable sandwiching part 12a toward the front side so as to form cantilever-shapes and are brought into contact with the electrically-conductive signal path CPa of the wiring pattern CP.

The cable sandwiching part 12a among them includes a rear-side beam part 12c, which will be described later; the cable sandwiching part 12a has a clip beam structure which is formed to be bent so that a planarly-viewed shape including the rear-side beam part 12c forms an approximately "L" shape; and the cable sandwiching part is formed so as to sandwich the cable central conductor (signal line) SCa of the thin coaxial cable SC like a clip from the front-rear directions. At an intermediate part of the rear-side beam part 12c constituting the cable sandwiching part 12a, a recessed part for pressing the cable central conductor (signal line) SCa from the rear side is provided.

In the initial state before coupling the above described terminal part of the thin coaxial cable SC, the rear-side beam part 12c constituting the cable sandwiching part 12a is in an open state as shown in, for example, FIG. 7 and FIG. 8. More specifically, the rear-side beam part 12c in the initial state has a shape that extends like a plate obliquely toward the rear. In the state in which the terminal part of the thin coaxial cable SC is set so as to be received in the cable supporting part 14e as shown in FIG. 8, when the shell cover part 14b of the electrically-conductive shell 14 is pushed and bent to the direction extending approximately in the left-right direction (top-bottom direction of FIG. 3) together with the insulating pressing plate 11a as shown in FIG. 9, the rear-side beam part 12c of the cable sandwiching part 12a is also pushed and bent to the direction extending approximately in the left-right direction (top-bottom direction of FIG. 3) by the insulating pressing plate 11a, thereby pressing the cable central conductor (signal line) SCa from the rear side.

In this manner, the cable central conductor (signal line) SCa is sandwiched in an elliptically crushed shape, for example as shown in FIG. 4, at the cable sandwiching part 12a by the pressing action of the insulating pressing plate 11a. In the present embodiment, the thickness of the above described insulating pressing plate 11a is increased; therefore, impedance matching is well performed, and connector characteristics are improved.

The pair of elastic spring parts 12b and 12b constituting the electrically-conductive signal terminals (signal contacts) 12 is configured so as to form a pair corresponding to the upper and lower both surfaces of the coupling projection part MFa, and the electrically-conductive signal terminal 12 corresponding to one of the upper and lower both surfaces of the coupling projection part MFa and the electrically-conductive signal terminal 12 corresponding to the other one are configured to be symmetrical in the thickness direction of the coupling projection part MFa. Hereinafter, one of the electrically-conductive signal terminals 12 will be explained.

More specifically, in the part between the above described pair of electrically-conductive ground terminals (ground contacts) 13 and 13, the elastic spring part 12b corresponding to either one of the upper and lower both surfaces of the coupling projection part MFa is extending along a direction approximately parallel to the front-rear direction, which is the mating direction with respect to the coupling projection part MFa; and the above described electrically-conductive ground terminals (ground contacts) 13 and 13 for grounding are configured to be disposed in both sides of the left-right direction orthogonal to the mating direction to be adjacent to the elastic spring part 12b of the electrically-conductive signal terminal 12.

The elastic spring parts 12b constituting the above described electrically-conductive signal terminal (signal contact) 12 are extending so as to form cantilever beam shapes from the upper and lower both-end edge parts of the above described cable sandwiching part 12a toward the front. A free-end part, which is an extending-side front-end part of the elastic spring part 12b, is formed to be bent so as to bulge in a curved shape toward the surface of the coupling projection part MFa. An apex part of the curved projecting part serves as a signal contact part 12d. The signal contact part 12d provided at the elastic spring part 12b is provided at a position corresponding to the signal contact part provided in the electrically-conductive signal path CPa on the coupling projection part MFa in the above described manner, and the signal contact part 12d is brought into contact, with pressure, with the signal contact part on the electrically-conductive signal path CPa by the elastic displacing action of the elastic spring part 12b forming the above described cantilever beam shape, thereby establishing electrical connection.

At this point, the ground coupling plate 13b mutually coupling the pair of electrically-conductive ground terminals (ground contacts) 13 and 13 in the above described manner is disposed in the side closer to the front than the mating-direction front-end part (free-end part) of the electrically-conductive signal terminal (signal contact) 12 is. In other words, there is an arrangement relation that the electrically-conductive ground terminal 13 surrounds the periphery of the electrically-conductive signal terminal 12 in a planar view, and the ground contact part 13a provided in the electrically-conductive ground terminal 13 is disposed in the side closer to the front in the mating direction than the signal contact part 12 provided in the electrically-conductive signal terminal 12 is. Therefore, the signal contact part 12d of the electrically-conductive signal terminal 12 can be visually checked from the part between the electrically-conductive ground terminals 13.

In this manner, in the present embodiment, the single plug connector 10 is configured to be directly mated with the wall part of the product chassis MF; and, in the mated state of the single plug connector 10, the signal contact parts 12d of the electrically-conductive signal terminals (signal contacts) 12 and the contact parts 13a of the electrically-conductive ground terminals (ground contacts) 13 are brought into contact with both of the contact parts of the wiring pattern CP exposed from the upper and lower both surfaces of the coupling projection part MFa, in other words, with the electrically-conductive signal path CPa and the electrically-conductive ground paths CPb. Therefore, without the intermediation of a conventionally-used circuit board and an electrical connector (receptacle connector) serving as a mating counterpart mounted on the circuit board, electrical connection of a signal transmission medium can be established by a simple configuration.

Particularly, in the present embodiment, mating of the electrical connector 10 is carried out in the state in which the electrically-conductive ground terminals (ground contacts) 13 and the electrically-conductive signal terminals (signal contacts) 12 are in contact, with pressure, with both of the upper and lower surfaces of the coupling projection part MFa of the product chassis MF; therefore, the pressing force of both of the electrically-conductive contacts 13 and 12 can be approximately uniformly applied without unevenness so as to cancel out the force with the upper and lower both surfaces of the coupling projection part MFa. The mating structure of the electrical connector 10 is composed of both of the upper and lower surfaces of the product chassis MF; therefore, the protruding distance in the thickness direction of the wall part of the product chassis is reduced, and the thickness of the electrical connector 10 is reduced. Moreover, even when the electrical connector 10 is reversed with respect to the upper and lower both surfaces of the product chassis MF and mated therewith, a similar mating structure can be obtained; therefore, the degree of freedom in the extending direction of the terminal part of the thin coaxial cable SC, which is a signal transmission medium, is increased.

Moreover, the present embodiment has the configuration that the electrically-conductive ground terminals (ground contacts) 13 and 13 for grounding are disposed in both sides of the electrically-conductive signal terminals (signal contacts) 12; therefore, impedance adjustment with respect to the electrically-conductive signal terminals 12 is carried out well.

Furthermore, in the present embodiment, the ground coupling plate 13b integrally coupling the electrically-conductive ground terminals (ground contacts) 13 and 13 for grounding, which are disposed in both sides of the electrically-conductive signal terminals (signal contacts) 12, to each other is disposed in the side closer to the front than the mating-direction front-end parts of the electrically-conductive signal terminals 12 are. Therefore, the free-end parts of the electrically-conductive ground terminals 13 are retained by the ground coupling plate 13b to enhance the rigidity thereof, the free-end parts of the electrically-conductive signal terminals 12 are protected by the ground coupling plate 13b, deformation thereof upon mating of the electrical connector 10 is prevented, and good mating operation is carried out. In addition to that, deformation of the free-end parts of the electrically-conductive signal terminals 12 can be checked before mating.

Furthermore, in the present embodiment, the lock parts MFb and the lock engaging parts 15, which are configured so as to be able to be mutually engaged/disengaged in the mating direction, are provided in the coupling projection part MFa and the shell mating parts 14c serving as the main-body part. Therefore, the electrical connection state of the electrically-conductive signal terminals (signal contacts) 12 and the electrically-conductive ground terminals (ground contacts) 13 is stably maintained, and mating operation can be smoothly carried out since a clicking sensation upon mating can be obtained.

In this case, the lock engaging parts 15 and the electrically-conductive ground terminals 13 are integrally formed; therefore, the lock engaging parts 15 can be used as grounding members, a ground circuit can be added by providing an electrically-conductive ground path also at the position of contact between the lock engaging part 15 and the outer peripheral surface of the lock latching part MFb, and EMI effects and transmission characteristics can be improved.

Moreover, in the present embodiment, the ground contact parts 13a provided in the electrically-conductive ground terminals (ground contacts) 13 are disposed in the side closer to the front in the mating direction than the signal contact parts 12d of the electrically-conductive signal terminals (signal contacts) 12 are. Therefore, the load generated upon mating or removing of the electrical connector 10 with respect to the coupling projection part MFa is dispersed among the electrically-conductive ground terminals 13 and the electrically-conductive signal terminals 12, workability is improved since the working force in the mating/removing of the electrical connector 10 is reduced, and, since the ground circuit is formed before the signal circuit is formed, the ground circuit functions as a protective circuit of the signal circuit to improve safety.

Hereinabove, the invention accomplished by the present inventor has been explained in detail based on the embodiment. However, the present embodiment is not limited to the above described embodiment, and it goes without saying that various modifications can be made within the range not departing from the gist thereof.

For example, the present invention is applied to an electrical connector of a horizontal mating type in the above described embodiment; however, the present invention can be similarly applied also to an electrical connector of a vertical mating type.

Furthermore, the present invention is not limited to a connector for a single thin coaxial cable like the above described embodiment, but the present invention can be similarly applied to, for example, a connector for thin coaxial cables disposed in a multipolar manner, an electrical connector of a type in which a plurality of thin coaxial cables and insulating cables are mixed, and an electrical connector coupled to, for example, a flexible wiring board.

Industrial Applicability

As described above, the present embodiment can be widely applied to a wide variety of electrical connectors used in various electrical devices.

Reference Signs List

10 Plug connector
11 Insulating housing (main body part)
11a Insulating pressing plate
12 Electrically-conductive signal terminal (signal contact)
12a Cable sandwiching part
12b Elastic spring part 12c Rear-side beam part
12d Signal contact part
13 Electrically-conductive ground terminal (ground contact)
13a Ground contact part
13b Ground coupling plate
14 Electrically-conductive shell
14a Shell main-body part
14b Shell cover part
14c Shell mating part (main body part)
14e Cable supporting part
14f Shell coupling plate
14g First retaining part
14h Second retaining part
15 Lock engaging part (lock part)
SC Thin coaxial cable (signal transmission medium)
SCa Cable central conductor (signal line)
SCb Cable external conductor (shield line)
MF Product chassis
MFa Coupling projection part
MFb Lock latching part (lock part)
CP Wiring pattern
CPa Electrically-conductive signal path
CPb Electrically-conductive ground path

The invention claimed is:

1. An electrical connector for electrically connecting a terminal part of a signal transmission medium to a wiring pattern of a wall part of a product chassis, the wiring pattern formed on a surface of the wall part constituting the product chassis of an electronic device having a predetermined electronic circuit, the electrical connector having a main body part to which an electrically-conductive contact having a contact part elastically in contact with the wiring pattern is attached, wherein a coupling projection part composed of a plate-like member is provided in the wall part constituting the product chassis so as to project like a cantilever, and the main body part is configured to be able to be mated with the coupling projection part, wherein the wiring pattern is provided with a contact part exposed from at least one of upper and lower both surfaces of the plate-like member constituting the coupling projection part, wherein the electrically-conductive contact is disposed so as to extend along a direction approximately parallel to a direction of mating with the coupling projection part, wherein the contact part of the electrically-conductive contact is disposed so as to sandwich the coupling projection part from the upper and lower both surfaces and be in contact with the contact part of the wiring pattern in a state in which the main body part is mated with the coupling projection part, wherein the electrically-conductive contact is composed of a signal contact for transmitting a signal, ground contacts for grounding are disposed on both sides of the signal contact, and a ground coupling plate integrally coupling the ground contacts for grounding is disposed on both sides of the signal contact to each other is provided, and wherein the ground coupling plate is disposed on a side closer to a front than a mating-direction front-end part of the signal contact is.

2. The electrical connector according to claim 1, wherein the coupling projection part and the main body part are provided with a lock part configured to enable engagement/disengagement in the mating direction.

3. The electrical connector according to claim 1, wherein a contact part provided in the ground contact is disposed in a side closer to a front in the mating direction than a contact part provided in the signal contact is.

4. An electrical connector assembly comprising:
a product chassis constituting an electronic device having a predetermined electronic circuit and having a wiring pattern for transmitting a signal formed on a surface of a wall part; and
the electrical connector according to claim 1.

5. An electrical connector assembly comprising:
a product chassis constituting an electronic device having a predetermined electronic circuit and having a wiring pattern for transmitting a signal formed on a surface of a wall part; and
the electrical connector according to claim 2.

6. An electrical connector assembly comprising:
a product chassis constituting an electronic device having a predetermined electronic circuit and having a wiring pattern for transmitting a signal formed on a surface of a wall part; and
the electrical connector according to claim 3.

7. An electrical connector for electrically connecting a terminal part of a signal transmission medium to a wiring pattern of a wall part of a product chassis, the wiring pattern formed on a surface of the wall part constituting the product chassis of an electronic device having a predetermined electronic circuit, the electrical connector having a main body part to which an electrically-conductive contact having a contact part elastically in contact with the wiring pattern is attached, wherein a coupling projection part composed of a plate-like member is provided in the wall part constituting the product chassis so as to project like a cantilever, and the main body part is configured to be able to be mated with the coupling projection part, wherein the wiring pattern is provided with a contact part exposed from at least one of upper and lower both surfaces of the plate-like member constituting the coupling projection part, wherein the electrically-conductive contact is disposed so as to extend along a direction approximately parallel to a direction of mating with the coupling projection part, wherein the contact part of the electrically-conductive contact is disposed so as to sandwich the coupling projection part from the upper and lower both surfaces and be in contact with the contact part of the wiring pattern in a state in which the main body part is mated with the coupling projection part, and wherein the coupling projection part and the main body part are provided with a lock part configured to enable engagement/disengagement in the mating direction.

* * * * *